United States Patent
Lin et al.

(10) Patent No.: US 11,937,371 B2
(45) Date of Patent: Mar. 19, 2024

(54) RADIO FREQUENCY SYSTEM AND COMMUNICATION DEVICE

(71) Applicant: MEDIATEK Inc., Hsin-Chu (TW)

(72) Inventors: Wun-Jian Lin, Hsinchu (TW); Chung-Hsin Chiang, Hsinchu (TW); Yeh-Chun Kao, Hsinchu (TW); Shih-Huang Yeh, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 209 days.

(21) Appl. No.: 17/366,468

(22) Filed: Jul. 2, 2021

(65) Prior Publication Data
US 2022/0046787 A1 Feb. 10, 2022

Related U.S. Application Data

(60) Provisional application No. 63/060,738, filed on Aug. 4, 2020.

(51) Int. Cl.
*H04B 1/40* (2015.01)
*H01Q 1/12* (2006.01)
*H01Q 1/22* (2006.01)
*H05K 1/02* (2006.01)

(52) U.S. Cl.
CPC .............. *H05K 1/028* (2013.01); *H01Q 1/12* (2013.01); *H04B 1/40* (2013.01); *H05K 2201/10098* (2013.01)

(58) Field of Classification Search
CPC ... H04B 1/40; H01Q 1/12; H01Q 1/22; H05K 1/028; H05K 1/02; H05K 1/0277
See application file for complete search history.

(56) References Cited

U.S. PATENT DOCUMENTS

| 2018/0026341 A1* | 1/2018 | Mow | H01Q 1/243 |
| | | | 343/702 |
| 2020/0014090 A1* | 1/2020 | Jung | H01Q 1/38 |
| 2020/0194893 A1 | 6/2020 | Im | |

FOREIGN PATENT DOCUMENTS

WO WO-2020166812 A1 * 8/2020 ............. H01Q 1/243

OTHER PUBLICATIONS

Chinese language office action dated Jul. 5, 2022, issued in application No. TW 110128558.

* cited by examiner

*Primary Examiner* — Blane J Jackson
(74) *Attorney, Agent, or Firm* — McClure, Qualey & Rodack, LLP

(57) ABSTRACT

A radio frequency (RF) system and a communication device are provided. The RF system includes a flexible circuit board, a first antenna module and a RF module. The flexible circuit board has a first surface and a second surface, and the first surface and the second surface are located at different sides of the flexible circuit board. The first antenna module is disposed on the first surface of the flexible circuit board. The first antenna module includes a first carrier, a first antenna element disposed on or in the first carrier, and a first conductive member between the first carrier and the flexible circuit board. The RF module is disposed on the second surface of the flexible circuit board and electrically connected to the first antenna module.

20 Claims, 11 Drawing Sheets

RADIO FREQUENCY SYSTEM AND COMMUNICATION DEVICE

This application claims the benefit of U.S. provisional application No. 63/060,738, filed Aug. 4, 2020, the disclosure of which is incorporated by reference herein in its entirety.

TECHNICAL FIELD

The present invention relates in general to a system and a device, and more particularly to a radio frequency (RF) system and a communication device.

BACKGROUND

Wireless communication technology is now widely used in a wide variety of consumer electronic products (for example, a communication device such as mobile phone, tablet computer, laptop, etc.) to receive or transmit various wireless signals. In this regard, an antenna and a communication module (e.g., an IC package with RF devices) are often necessary for wireless communication, so that the antenna can transmit and receive signals from the communication module. For a wireless communication in millimeter wave bands, it is desired for a shorter interconnection between the antenna and the communication module. To obtain a better antenna performance, a thick build-up layer is usually required. However, a thick build-up layer may not be applicable to the current trend in a communication device, which pursues a thin build-up layer with dense interconnections that may suits for various communication devices with flexibility.

SUMMARY

The present invention is directed to a radio frequency (RF) system and a communication device. The first antenna module includes a first carrier and a first antenna element disposed on or in the first carrier, thereby overcoming the deficiencies and defects of the existing technology.

According to one embodiment, a radio frequency system is provided. The RF system includes a flexible circuit board, a first antenna module and a RF module. The flexible circuit board has a first surface and a second surface, and the first surface and the second surface are located at different sides of the flexible circuit board. The first antenna module is disposed on the first surface of the flexible circuit board. The first antenna module includes a first carrier, a first antenna element disposed on or in the first carrier, and a first conductive member between the first carrier and the flexible circuit board. The RF module is disposed on the second surface of the flexible circuit board and electrically connected to the first antenna module.

According to another embodiment, a RF system is provided. The RF system includes a flexible circuit board having a notch, a first antenna module disposed on the flexible circuit board and covering the notch, and a RF chip disposed in the notch. The first antenna module includes a first carrier, a first antenna element disposed on or in the first carrier, and a first conductive member between the first carrier and the flexible circuit board.

According to an alternative embodiment, a communication device is provided. The communication device includes a housing, a first RF system, a second RF system, a main board and a connection element. The first RF system and the second RF system are respectively located at a first position and a second position in the housing. Each of the first RF system and the second RF system includes a flexible circuit board, a first antenna module and a RF module. The flexible circuit board has a first surface and a second surface, and the first surface and the second surface are located at different sides of the flexible circuit board. The first antenna module is disposed on the first surface of the flexible circuit board. The first antenna module includes a first carrier, a first antenna element disposed on or in the first carrier, and a first conductive member between the first carrier and the flexible circuit board. The RF module is disposed on the second surface of the flexible circuit board and electrically connected to the first antenna element through the flexible circuit board, the first conductive member and the first carrier. The connection element electrically connects the flexible circuit board and the main board.

Figure 1:
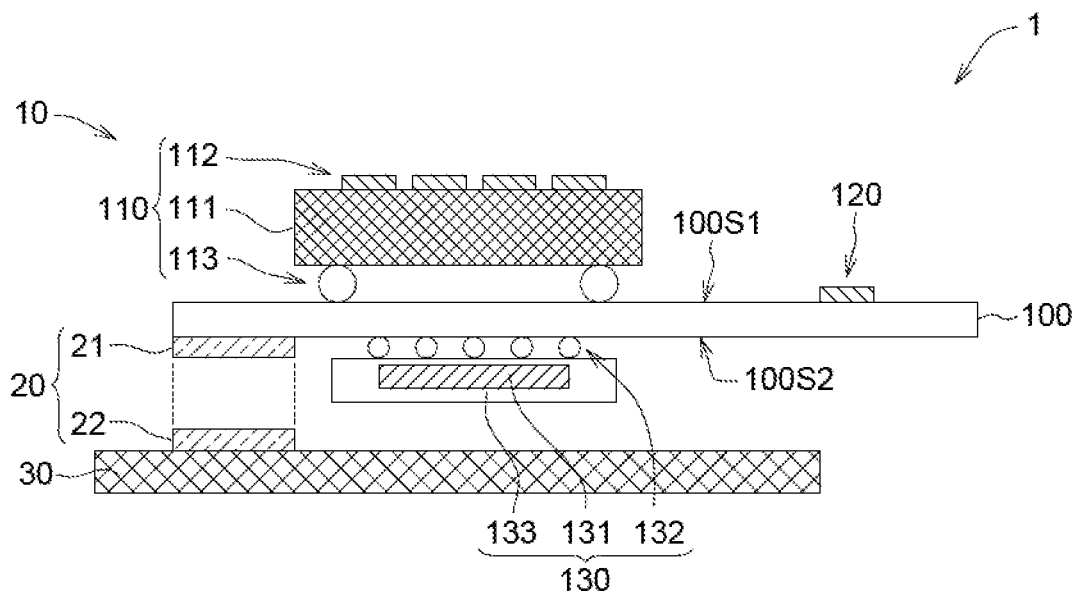
FIG. 1 shows a cross-sectional view of a communication device according to one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Each embodiment of the present invention will be described in detail hereinafter, and illustrated with the accompanying drawings. In addition to these detailed descriptions, the present invention may be broadly practiced in other embodiments, and any substitution, modification, or equivalent variation of any of the described embodiments is included within the scope of the present invention, subject to the scope of the claims thereafter. In the description of the specification, many specific details are provided in order to give the reader a more complete understanding of the present invention; however, the present invention may be practiced with the omission of some or all of these specific details. In addition, well-known steps or elements are not described in detail to avoid unnecessary limitations of the present invention. Identical or similar elements in the drawings will be indicated by identical or similar reference numerals. In particular, the drawings are only for illustrative purposes and do not represent the actual size or number of elements, unless they are otherwise indicated.

It should be noted that in the description of the present invention, the terms "first", "second", etc. are used only for distinguishing similar elements, and there is no order of precedence between them, nor should they be construed as indicating or implying relative importance.

Referring to FIG. 1, a cross-sectional view of a communication device 1 according to one embodiment of the present invention is shown. The communication device 1 may be a wireless communication product, including a radio frequency (RF) system 10 and a main board 30. The main board 30 may be, for example, a print circuit board.

The RF system 10 may include a flexible circuit board 100, at least one antenna module (for example, a first antenna module 110 and a second antenna module 120) and a RF module 130. The flexible circuit board 100 may be a flexible print circuit board, including a stack of dielectric films which may be made of any one of polyimide (PI), modified polyimide (MPI), liquid crystal polymer (LCP), etc. or a combination thereof, but the present invention is not limited thereto. The flexible circuit board 100 has a first surface 100S1 and a second surface 100S2. The first surface 100S1 and the second surface 100S2 are located at different sides of the flexible circuit board 100. In one embodiment, the first surface 100S1 is an upper surface of the flexible circuit board 100, and the second surface 100S2 is a lower surface of the flexible circuit board 100 opposite to the first surface 100S1; but the present invention is not limited thereto. The first antenna module 110 may be disposed on the first surface 100S1 of the flexible circuit board 100. The RF module 130 may be disposed on the second surface 100S2 of the flexible circuit board 100. The first antenna module 110 and the RF module 130 may be electrically connected to the flexible circuit board 100, respectively.

The first antenna module 110 may include a first carrier 111, a first antenna element 112 and a first conductive member 113. The first antenna element 112 may be disposed on or in the first carrier 111. The first carrier 111 may be a multilayer board of substrate or printed circuit board (PCB). The first antenna element 112 may be any suitable type of antenna, such as patch antenna, stacked patch antenna, dipole antenna, monopole antenna, etc., for radiating and receiving electromagnetic signals, such as RF wireless signals or millimeter wave (mmW) signals. For example, the first antenna element 112 may include an antenna array as shown in FIG. 1. In one embodiment, the first antenna element 112 may be formed on a top surface of the first carrier 111. In another embodiment not illustrated in FIG. 1, the first antenna element 112 may be disposed at any place of the first carrier 111 according to the design requirement. For example, the first antenna element 112 may be formed in the first carrier 111; alternatively, the first antenna element 112 may be formed on a bottom surface or a side surface of the first carrier 111.

The first conductive member 113 is disposed between the first carrier 111 and the flexible circuit board 100 so that the first antenna module 110 may be electrically connected to the flexible circuit board 100. In detail, the first carrier 111 may include conductive structures (not illustrated) formed therein or thereon to electrically connect the first antenna element 112 to the first conductive member 113, so that the signals may be transmitted between the first antenna element 112 and the first conductive member 113 via the conductive structures. The first conductive member 113 may be solder balls, solder bumps, solder paste, copper bumps, gold bumps, or any suitable conductive means which may electrically connect the conductive structures of the first carrier 111 to conductive traces of the flexible circuit board 100 on the first surface 100S1 (not illustrated) in the form of one or more solder pads. Thus, the signals may be further transmitted to or from the flexible circuit board 100.

The RF module 130 may include a RF chip 131. Although not illustrated, in some embodiments, the RF module 130 may also include other elements, for example, the passive elements such as resistors, capacitors and inductors. In one embodiment, the RF module 130 may be a system-in-package module, further including an encapsulation layer 133 that encapsulates the RF chip 131. The RF module 130 may further include a conductive element 132 for electrically connecting the RF chip 131 to the flexible circuit board 100. In addition, the RF module 130 may also include a redistribution layer (not illustrated) disposed between an active surface of the RF chip 131 and the conductive element 132. The RF chip 131 may be electrically connected to the conductive element 132 by the redistribution layer. The conductive element 132 may be solder balls, solder bumps, copper bumps, solder paste, gold bumps, or any suitable conductive means which may electrically connect the RF chip 131 to conductive traces of the flexible circuit board 100 on the second surface 100S2 (not illustrated) in the form of one or more solder pads.

Further, the flexible circuit board 100 may also include an interconnection layer (not illustrated) electrically connected between the conductive traces of the flexible circuit board 100 on the first surface 100S1 and the conductive traces of the flexible circuit board 100 on the second surface 100S2. Thus, the RF module 130 on the second surface 100S2 of the flexible circuit board 100 may be electrically connected to the first antenna module 110 on the first surface 100S1 of the flexible circuit board 100, so as to further trigger the first antenna element 112.

Moreover, the RF system 10 may further include a second antenna module 120 disposed on the flexible circuit board 100. In one embodiment, the second antenna module 120 is disposed on the first surface 100S1 of the flexible circuit board 100. Compared to the first antenna module 110, the second antenna module 120 is more distant from the RF module 130. The second antenna module 120 may include an antenna array formed of at least one radiative antenna, which may be triggered by the RF module 130. The radiative antenna may be, but not limited to, any suitable type of antenna, such as patch antenna, stacked patch antenna, dipole antenna, monopole antenna, etc. The second antenna module 120 may have the same orientation and/or polarization as the first antenna module 110, or a different orientation and/or polarization than the first antenna module 110.

As shown in FIG. 1, the RF system 10 may be electrically connected to the main board 30 through a connection element 20, so that the RF system 10 may communicate with other components disposed on the main board 30. The connection element 20 may include a first connector 21 disposed on the flexible circuit board 100 and a second connector 22 disposed on the main board 30. An electrical connector (indicated in dotted line as shown in FIG. 1), e.g., a flexible print circuit, may be connected between the first connector 21 and the second connector 22 as a conductive medium.

With the configuration shown in FIG. 1, the first antenna element 112 is disposed on or in the first carrier 111 with a thickness of approximately 500-600 μm, instead of being disposed directly on the flexible circuit board 100. Thus, there is no need to have a thick flexible circuit board for the first antenna element 112, and the first antenna element 112 may preserve its desired antenna performance. In addition, the flexible circuit board 100 may have a thickness less than 300 μm, maintaining its flexible property.

FIG. 2 to FIG. 12 illustrate some exemplary variations of the communication device 1 as shown in FIG. 1 according to some alternative embodiments of the present invention, wherein the same reference numerals denote the same layers, regions or elements. It should be understood that the features of the alternative embodiments described below may be combined with each other unless otherwise specifically noted.

Figure 2:
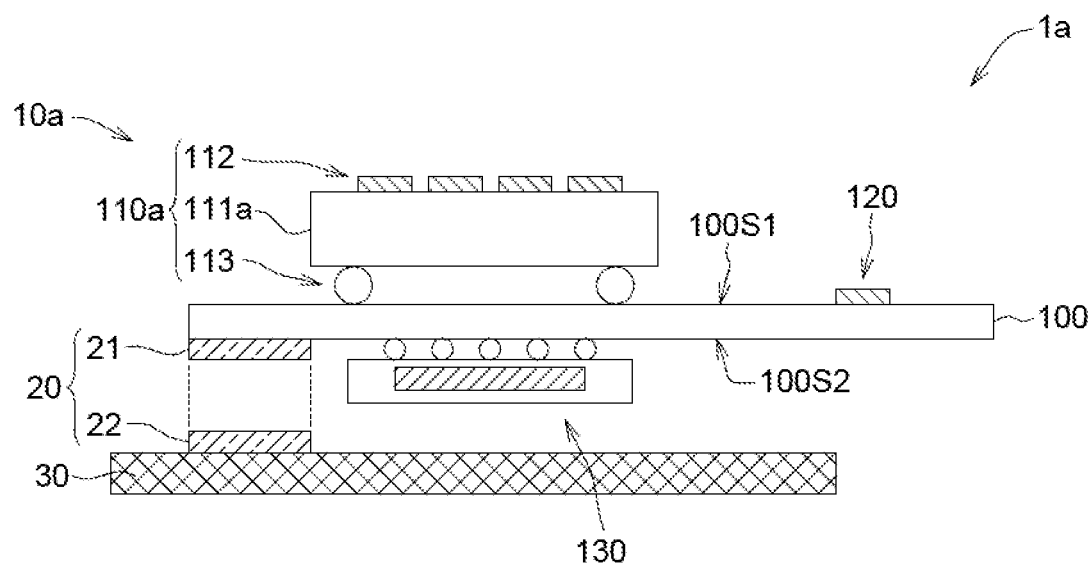
FIG. 2 shows a cross-sectional view of a communication device according to a first alternative embodiment of the present invention.

FIG. 2 shows a cross-sectional view of a communication device 1a according to a first alternative embodiment of the present invention. As shown in FIG. 2 with reference to FIG. 1, the difference between the communication device 1a and the communication device 1 is the first antenna module 110a of the first RF system 10a. Specifically, the first carrier 111a of the first antenna module 110a is a multilayer board of flexible material. In one embodiment, the flexible material may be the same as the material of the dielectric films of the flexible circuit board 100.

Figure 3:
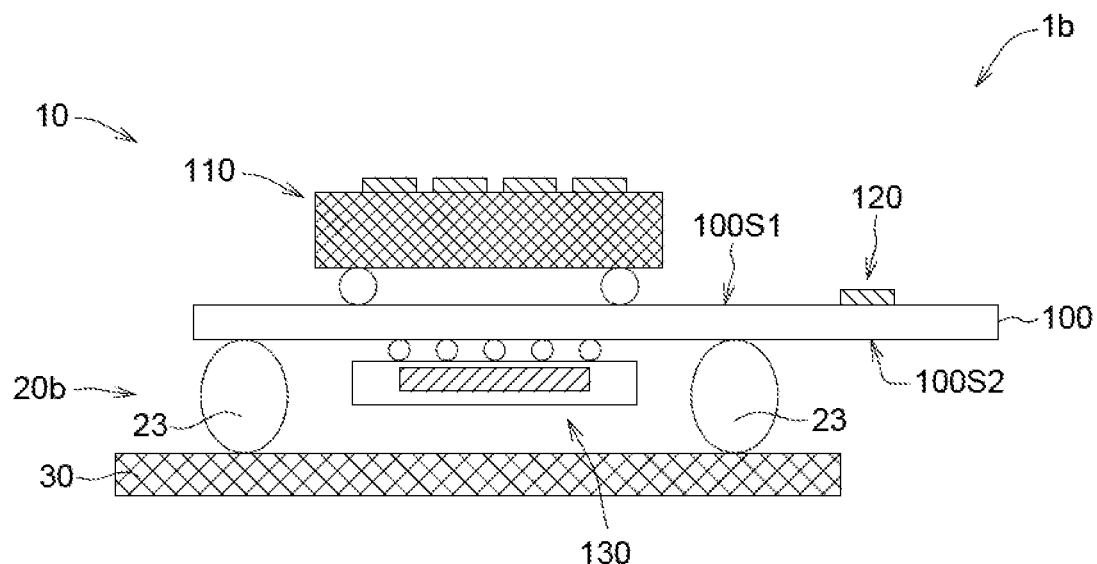
FIG. 3 shows a cross-sectional view of a communication device according to a second alternative embodiment of the present invention.

FIG. 3 shows a cross-sectional view of a communication device 1b according to a second alternative embodiment of the present invention. As shown in FIG. 3 with reference to FIG. 1, the difference between the communication device 1b and the communication device 1 is the connection element 20b. Specifically, the connection element 20b may include bonding elements 23, which may be solder balls, solder bumps, solder paste, copper bumps, gold bumps, or any suitable conductive means which may electrically connect the RF system 10 to the main board 30. Thus, using the connection element 20b may further save the cost of the first connector 21 and the second connector 22 shown in FIG. 1.

Figure 4:
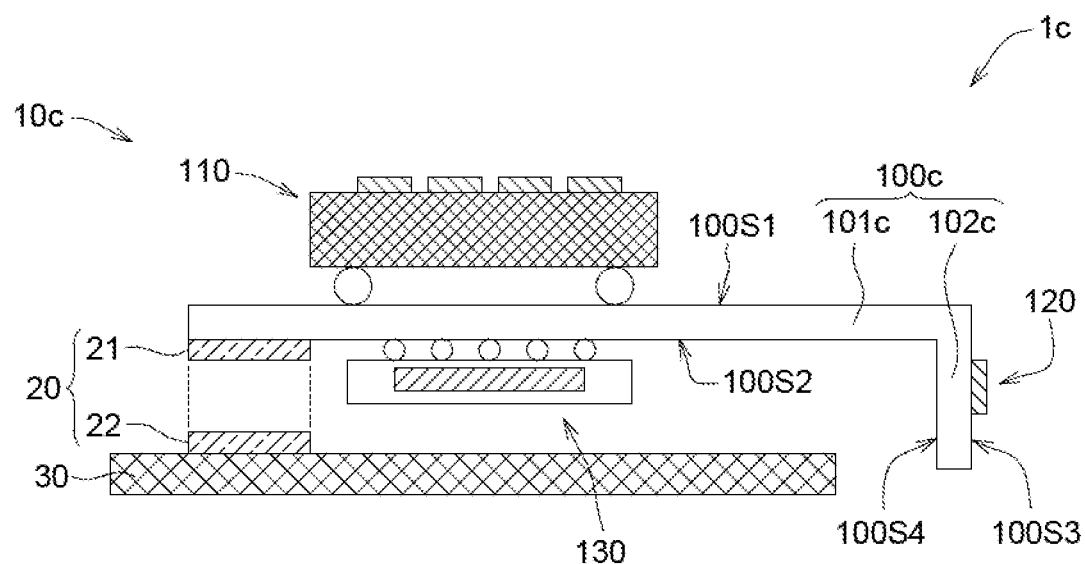
FIG. 4 shows a cross-sectional view of a communication device according to a third alternative embodiment of the present invention.

FIG. 4 shows a cross-sectional view of a communication device 1c according to a third alternative embodiment of the present invention. As shown in FIG. 4 with reference to FIG. 1, the difference between the communication device 1c and the communication device 1 is the flexible circuit board 100c of the RF system 10c. Specifically, the flexible circuit board 100c may include a first portion 101c and a second portion 102c. The second portion 102c may be bent with respect to the first portion 101c, and have a third surface 100S3 connecting the first surface 100S1 and a fourth surface 100S4 connecting the second surface 100S2. The first antenna module 110 may be disposed on the first portion 101c, and the second antenna module 120 may be disposed on the second portion 102c for a different orientation than the first antenna module 110. In one embodiment, the second antenna module 120 may be disposed on the third surface 100S3, but the present invention is not limited thereto. For example, in another embodiment not illustrated, the second portion 102c may be bent with respect to the first portion 101c towards a different direction from FIG. 4, and the second antenna module 120 may be disposed on the fourth surface 100S4. Thus, the RF system 10c may contain more than one radiation coverage.

Figure 5:
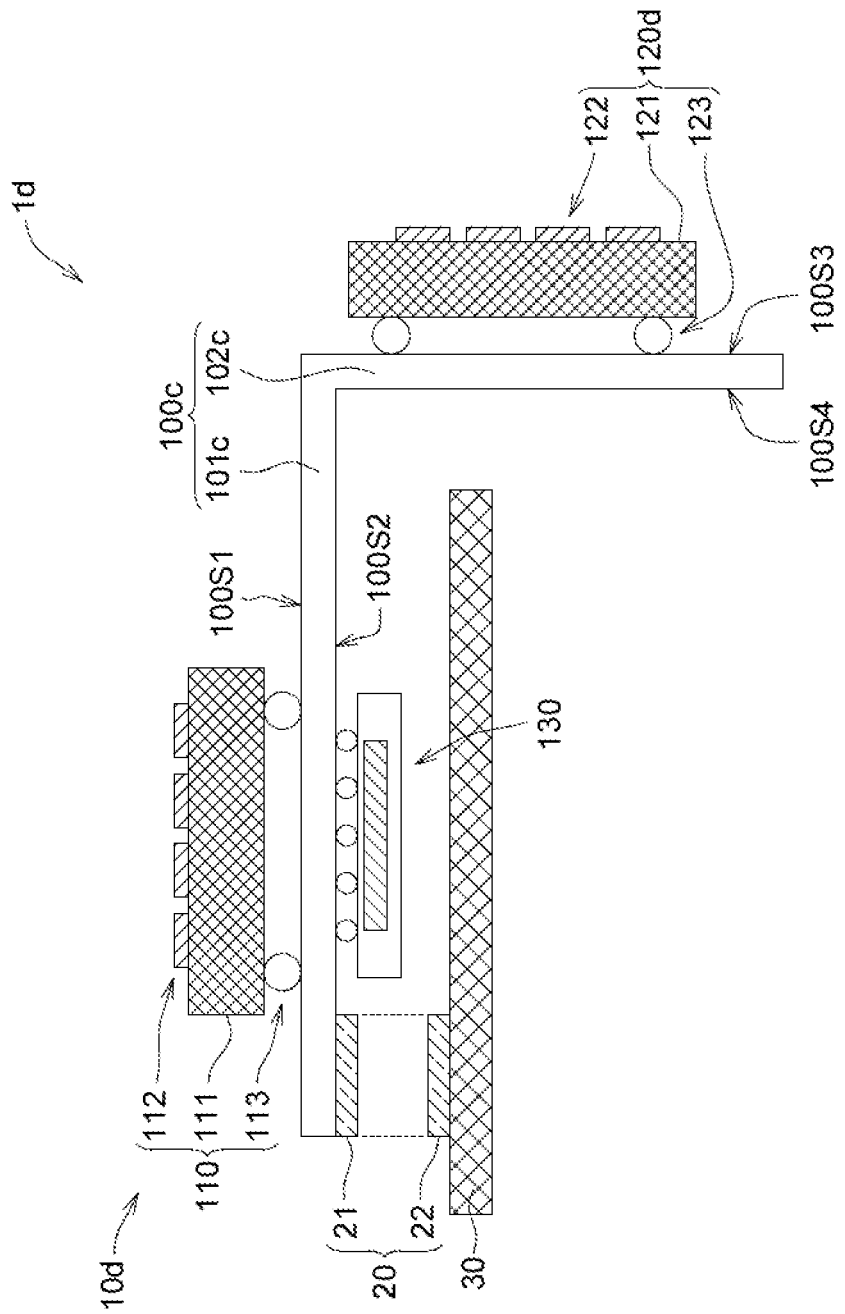
FIG. 5 shows a cross-sectional view of a communication device according to a fourth alternative embodiment of the present invention.

FIG. 5 shows a cross-sectional view of a communication device 1d according to a fourth alternative embodiment of the present invention. As shown in FIG. 5 with reference to FIG. 4, the RF system 10d may also contain more than one radiation coverage; the difference between the communication device 1d and the communication device 1c is that the second antenna module 120d may have similar configuration as the first antenna module 110. That is, the second antenna module 120d may also include a second carrier 121, a second antenna element 122 and a second conductive member 123, which may have similar configuration of the first carrier 111, the first antenna element 112 and the first conductive member 113, respectively. It is not repeated here again.

Figure 6:
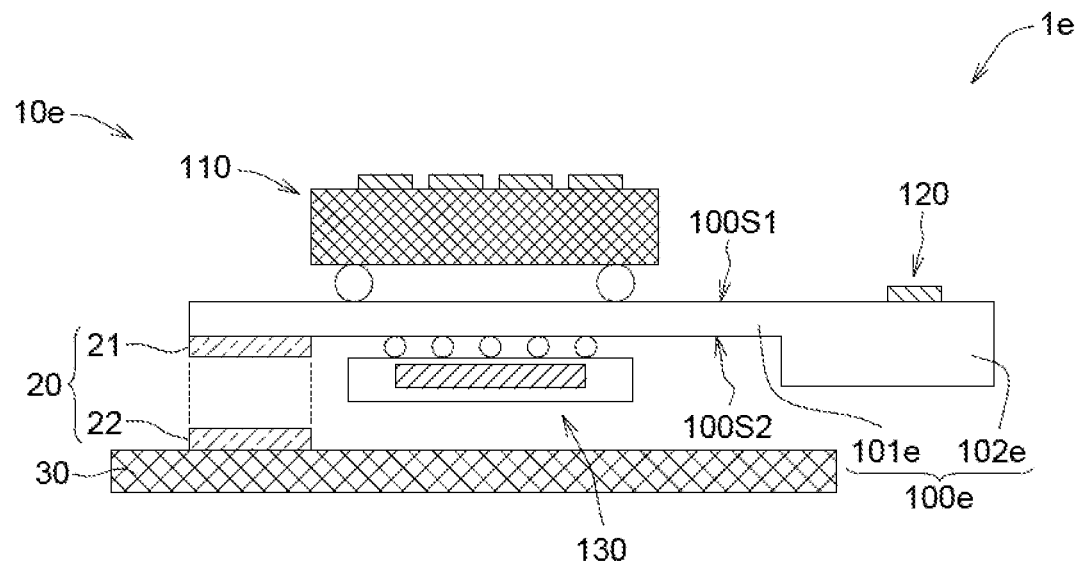
FIG. 6 shows a cross-sectional view of a communication device according to a fifth alternative embodiment of the present invention.

FIG. 6 shows a cross-sectional view of a communication device 1e according to a fifth alternative embodiment of the present invention. As shown in FIG. 6 with reference to FIG. 1, the difference between the communication device 1e and the communication device 1 is the flexible circuit board 100e of the RF system 10e. The flexible circuit board 100e may include a first portion 101e where the first antenna module 110 is disposed and a second portion 102e where the second antenna module 120 is disposed. The second portion 102e is thicker than the first portion 101e. Specifically, the second portion 102e may include stacked layers more than the first portion 101e, with a thickness of approximately 500-600 μm. Thus, the antenna performance for the second antenna module 120 may be further enhanced.

Figure 7:
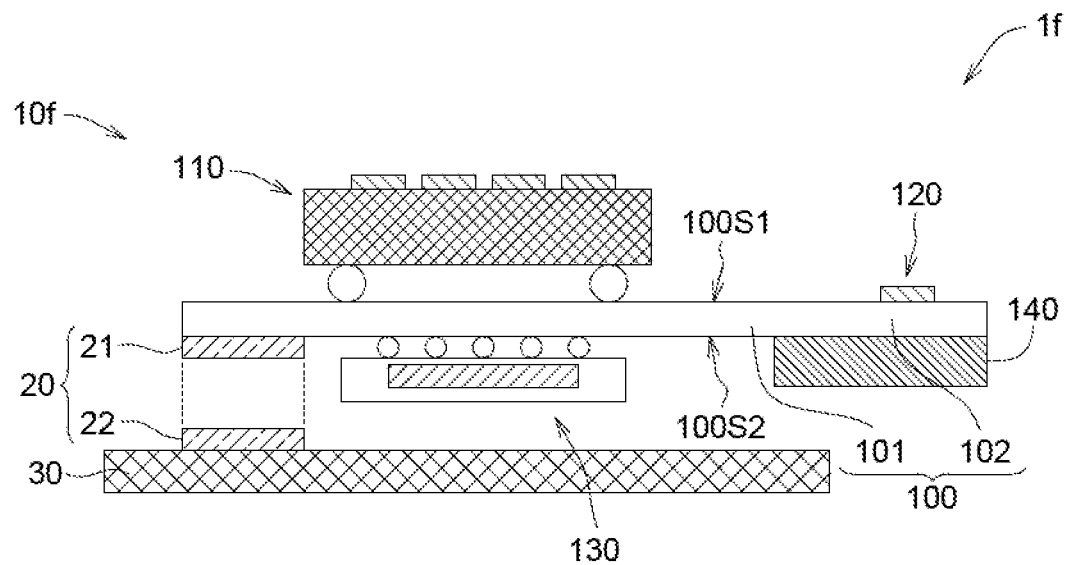
FIG. 7 shows a cross-sectional view of a communication device according to a sixth alternative embodiment of the present invention.

FIG. 7 shows a cross-sectional view of a communication device 1f according to a sixth alternative embodiment of the present invention. As shown in FIG. 7 with reference to FIG. 1, the difference between the communication device 1f and the communication device 1 is that the RF system 10f may further include a block element 140. The flexible circuit board 100 may include a first portion 101 where the first antenna module 110 is disposed and a second portion 102 where the second antenna module 120 is disposed. The block element 140 may be disposed on the flexible circuit board 100 and located opposite the second antenna module 120. Specifically, the block element 140 may be disposed on the second surface 100S2 of the flexible circuit board 100. In one embodiment, the block element 140 may have a metal cavity. In another embodiment, the block element 140 may include a multilayer circuit board. Thus, the antenna performance for the second antenna module 120 may be further enhanced.

Figure 8:
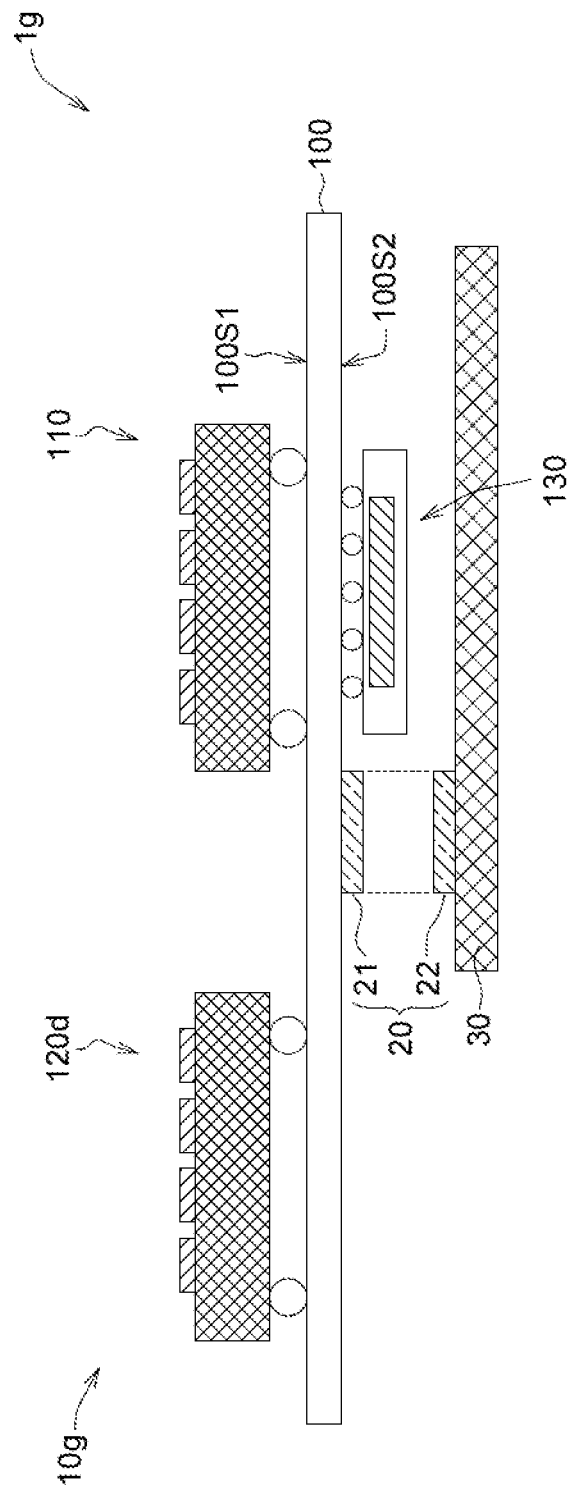
FIG. 8 shows a cross-sectional view of a communication device according to a seventh alternative embodiment of the present invention.

FIG. 8 shows a cross-sectional view of a communication device 1g according to a seventh alternative embodiment of the present invention. As shown in FIG. 8 with reference to FIG. 1, the difference between the communication device 1g and the communication device 1 is the second antenna module 120d of the RF system 10g, which has a similar configuration of the first antenna module 110. The second antenna module 120*d* may be located at a different side of the first antenna module 110 compared to the second antenna module 120 of FIG. 1.

Figure 9:
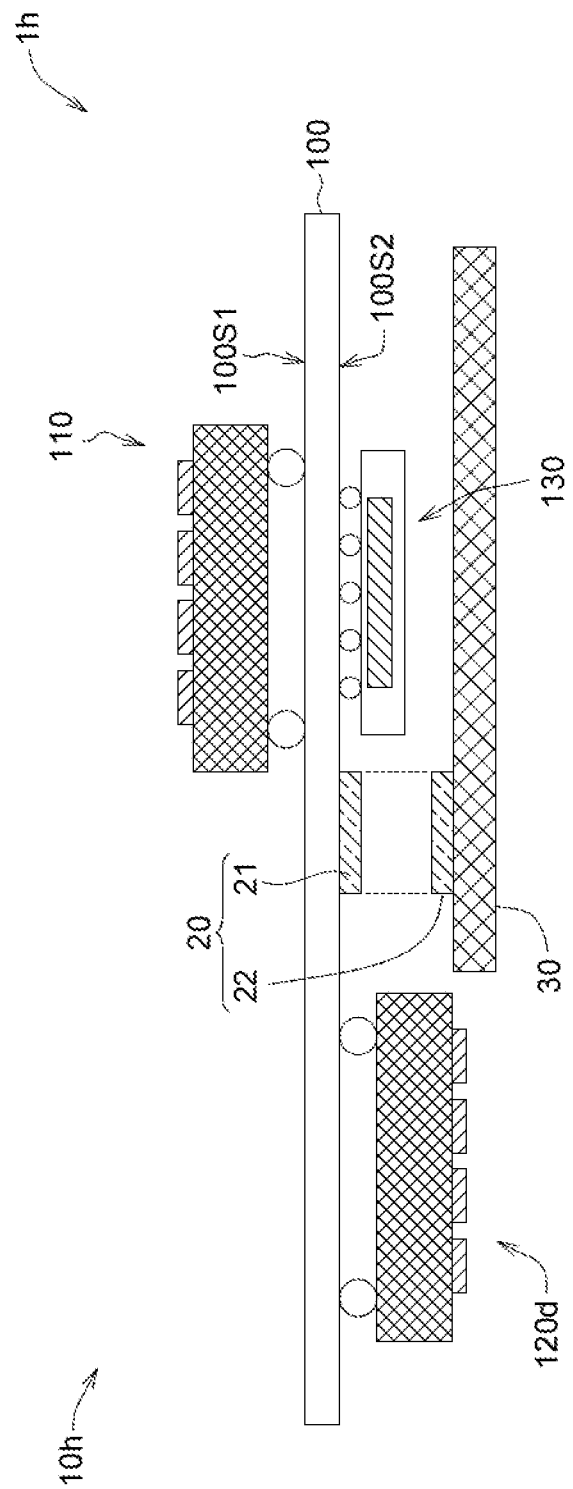
FIG. 9 shows a cross-sectional view of a communication device according to an eighth alternative embodiment of the present invention.

FIG. 9 shows a cross-sectional view of a communication device 1*h* according to an eighth alternative embodiment of the present invention. As shown in FIG. 9 with reference to FIG. 8, the difference between the communication device 1*h* and the communication device 1*g* is that the second antenna module 120*d* is disposed on the second surface 100S2 of the flexible circuit board 100 for a different orientation than the first antenna module 110. Thus, the RF system 10*h* may contain more than one radiation coverage and suit for any design of the communication device 1*h*.

Figure 10:
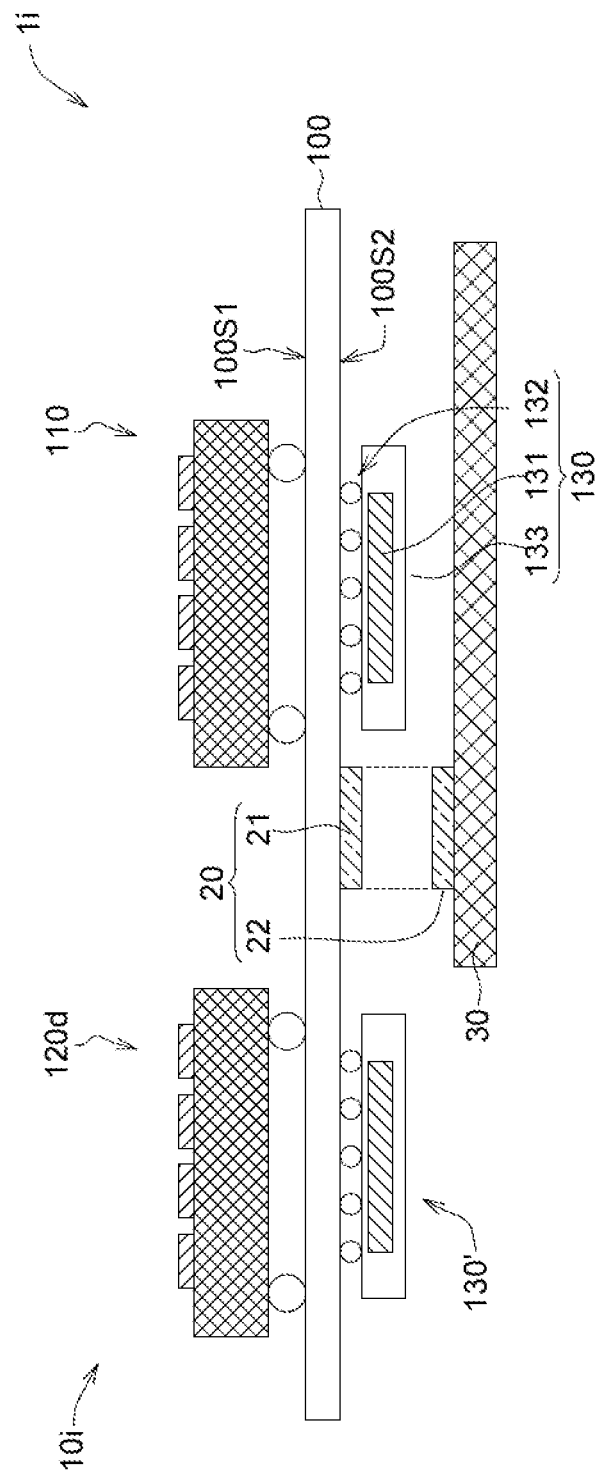
FIG. 10 shows a cross-sectional view of a communication device according to a ninth alternative embodiment of the present invention.

FIG. 10 shows a cross-sectional view of a communication device 1*i* according to a ninth alternative embodiment of the present invention. As shown in FIG. 10 with reference to FIG. 8, the difference between the communication device 1*i* and the communication device 1*g* is that the RF system 10*i* may further include an additional RF module 130' disposed on the flexible circuit board 100 and opposite the second antenna module 120*d*. That is, the additional RF module 130' may be disposed on the second surface 100S2 of the flexible circuit board 100. The additional RF module 130' may have the similar configuration as the RF module 130, and it is not repeated here again. In the present embodiment, the first antenna module 110 and the second antenna module 120*d* are triggered by the RF module 130 and the additional RF module 130', respectively. Thus, the feeding loss for the second antenna module 120*d* may be further minimized.

Figure 11:
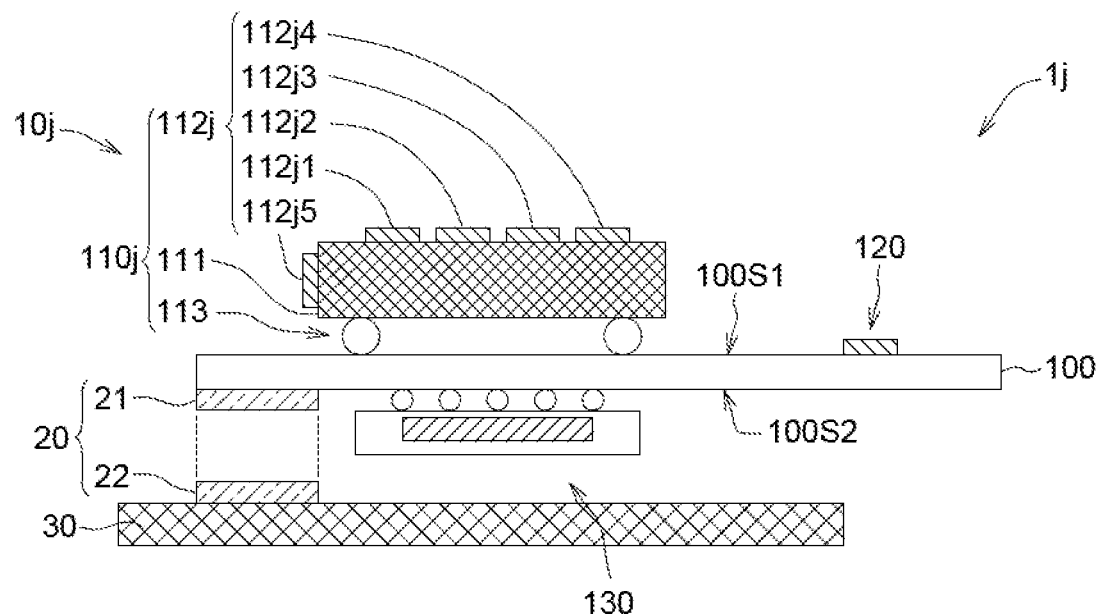
FIG. 11 shows a cross-sectional view of a communication device according to a tenth alternative embodiment of the present invention.

FIG. 11 shows a cross-sectional view of a communication device 1*j* according to a tenth alternative embodiment of the present invention. As shown in FIG. 11 with reference to FIG. 1, the difference between the communication device 1*j* and the communication device 1 is the first antenna module 110*j* of the RF system 10*j*. The first antenna element 112*j* of the first antenna module 110*j* may include an antenna array formed of at least one radiative antenna 112*ji*, 112*j*2, 112*j*3, 112*j*4, 112*j*5, and the antenna array may be disposed on more than one surface located at different sides of the first carrier 111. For example, the radiative antennas 112*ji*, 112*j*2, 112*j*3, 112*j*4 may be formed on a top surface of the first carrier 111, and the radiative antenna 112*j*5 may be formed on a side surface of the first carrier 111. Thus, the first antenna module 110*j* may provide more than one radiation coverage.

Figure 12:
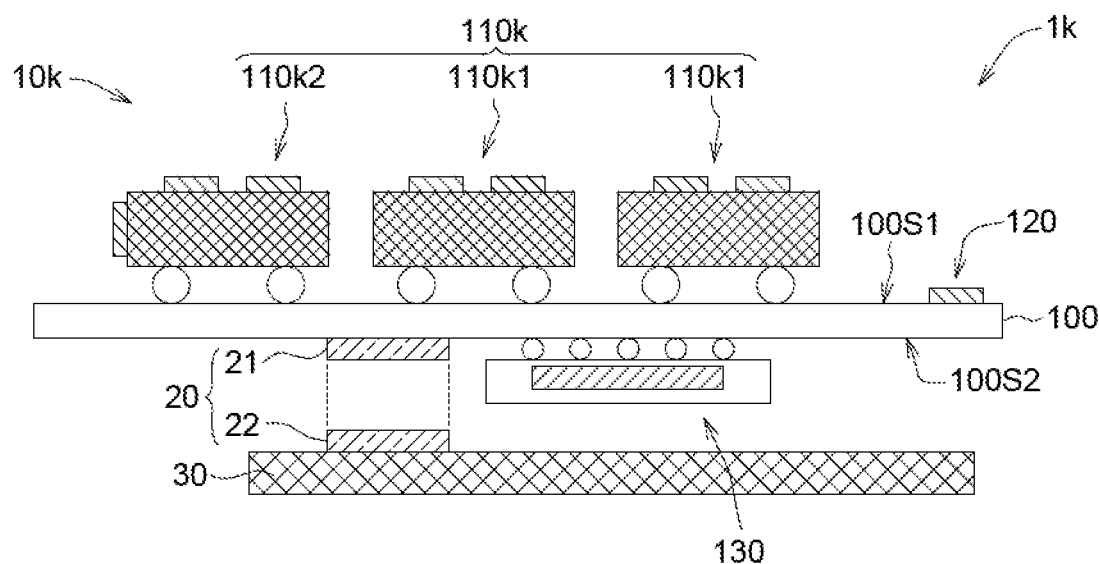
FIG. 12 shows a cross-sectional view of a communication device according to an eleventh alternative embodiment of the present invention.

FIG. 12 shows a cross-sectional view of a communication device 1*k* according to an eleventh alternative embodiment of the present invention. As shown in FIG. 12 with reference to FIG. 1, the difference between the communication device 1*k* and the communication device 1 is the first antenna module 110*k* of the RF system 10*k*. The first antenna module 110*k* may include more than one sub-module (e.g., two sub-modules 110*k*1 and one sub-module 110*k*2), and the sub-modules 110*k*1, 110*k*2 are configured to respectively support different bands in accordance with the standards for different countries.

Figure 13A:
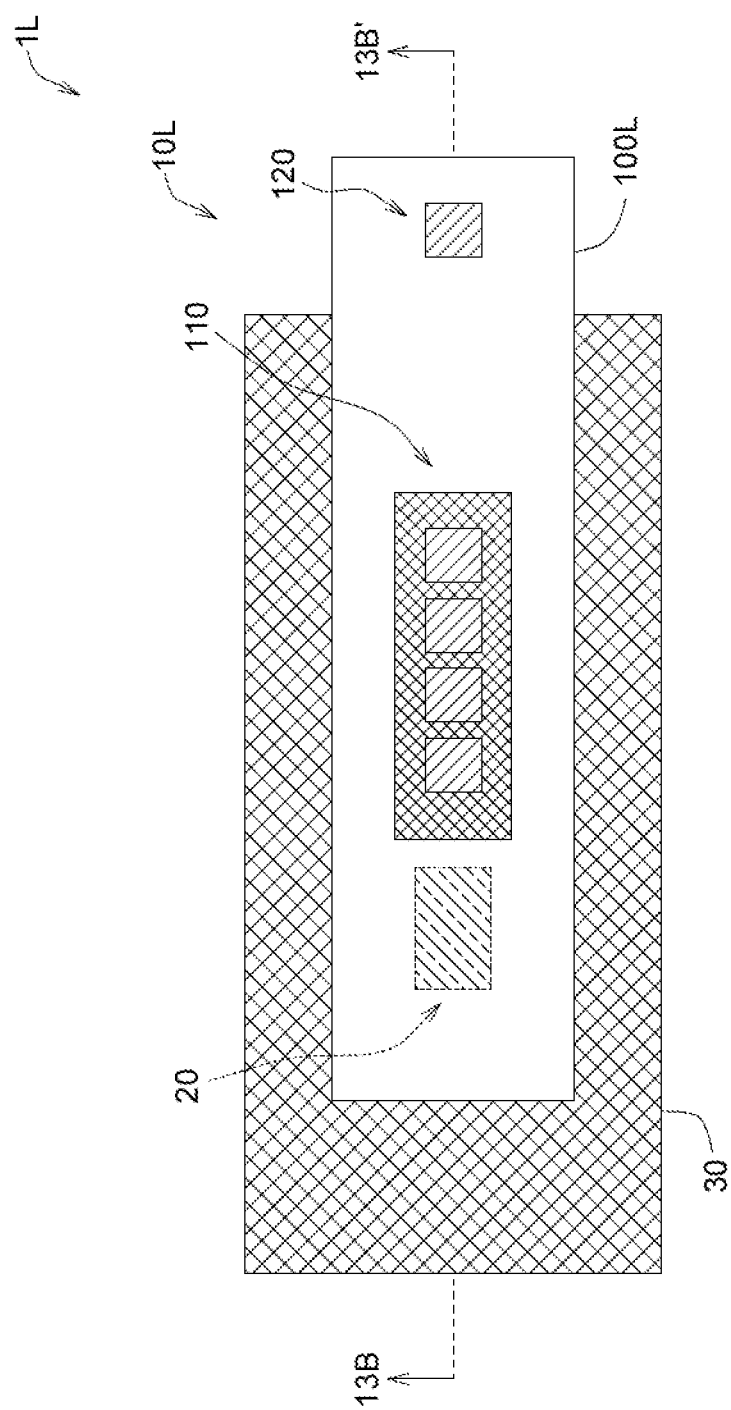
FIG. 13A shows a top view of a communication device according to another embodiment of the present invention.
Figure 13B:
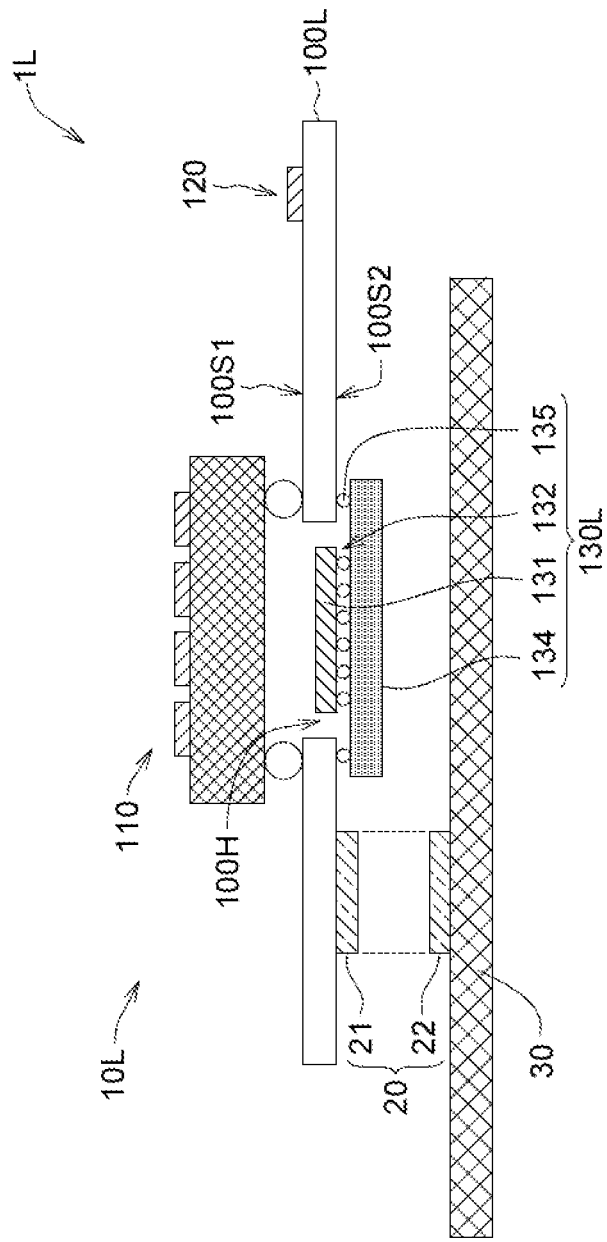
FIG. 13B shows a cross-sectional view of the communication device along the cutting plane line 13B-13B'.

FIG. 13A shows a top view of a communication device 1L according to another embodiment of the present invention. FIG. 13B shows a cross-sectional view of the communication device 1L along the cutting plane line 13B-13B'. As shown in FIG. 13A and FIG. 13B, the RF system 10L may include a flexible circuit board 100L having a notch 100H in a part between the first antenna module 110 and the RF module 130L, so that the first antenna module 110 covers the notch 100H. The RF chip 131 of the RF module 130L may be disposed within the notch 100H. The RF module 130L may include a chip carrier 134 electrically connected to the RF chip 131 via the conductive element 132. Moreover, the chip carrier 134 may be electrically to the flexible circuit board 100L via a conductive element 135. In one embodiment, the chip carrier 134 may be disposed on the second surface 100S2 of the flexible circuit board 100. Thus, the total thickness of the RF system 10L may be reduced.

Figure 14:
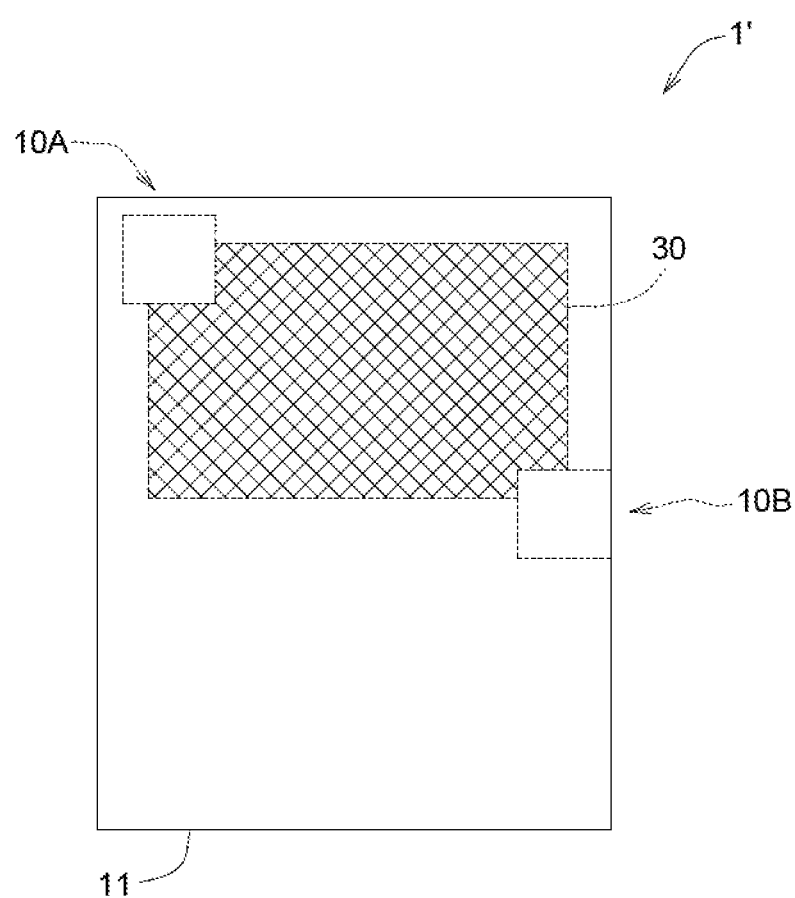
FIG. 14 shows a schematic diagram of a communication device according to still another embodiment of the present invention.

FIG. 14 shows a schematic diagram of a communication device 1' according to still another embodiment of the present invention. As shown in FIG. 14, the communication device 1' may include a housing 11, a first RF system 10A, a second RF system 10B and a main board 30. The first RF system 10A, the second RF system 10B and the main board 30 may be accommodated in the housing 11. The first RF system 10A and the second RF system 10B may be electrically connected to the main board 30 through the connection element (not illustrated), and may be any one of the RF systems as described above. The first RF system 10A and the second RF system 10B may be disposed adjacent to a respective dielectric window set on the rear face and/or the edge of the housing 11. The first RF system 10A may be located at a first position in the housing 11, and the second RF system 10B may be located at a second position in the housing 11. For example, the first position may be at a corner of the housing 11, and the second position may be close to a center portion of the longitudinal edge of the housing 11 for different user scenarios. When a user holds the communication device 1' horizontally with two hands, it may be possible to block the signals to and/or from the first RF system 10A. When the user holds the communication device 1' vertically with right hand, it may be possible to block the signals to and/or from the second RF system 10B. To solve the blocking issue, a control module (not illustrated) may be disposed on the main board 30 and electrically connected to the first RF system 10A and the second RF system 10B for detecting the signal quality of the first RF system 10A and the second RF system 10B. When one RF system has a worse signal quality, the control module may turn to the other RF system as the domination for radiating and receiving signals.

It will be apparent to those skilled in the art that various modifications and variations can be made to the disclosed embodiments. It is intended that the specification and examples be considered as exemplary only, with a true scope of the present invention being indicated by the following claims and their equivalents.

What is claimed is:

1. A radio frequency (RF) system comprising:
    a flexible circuit board comprising a first portion with no bending part, the first portion having a first surface and a second surface, wherein the first surface and the second surface are opposite surfaces of the first portion;
    a first antenna module disposed on the first surface, the first antenna module comprising a first carrier, a first antenna element disposed on or in the first carrier, and a first conductive member between the first carrier and the flexible circuit board;
    a second antenna module disposed on the flexible circuit board;
    a block element disposed on the flexible circuit board and located opposite the second antenna module; and
    a RF module disposed on the second surface and electrically connected to the first antenna module.

2. The RF system according to claim 1, wherein the first carrier is a multilayer board of flexible material, substrate or printed circuit board PCB).

3. The RF system according to claim 1, wherein the block element comprises a metal cavity or a multilayer circuit board.

4. The RF system according to claim 1, wherein the second antenna module is disposed on the first surface or the second surface of the flexible circuit board.

5. The RF system according to claim 1, wherein the second antenna module comprises a second carrier, a second antenna element disposed on or in the second carrier, and a second conductive member between the second carrier and the flexible circuit board.

6. The RF system according to claim 1, wherein the first antenna module comprises more than one sub-module respectively supporting different bands.

7. The RF system according to claim 1, wherein the first antenna element comprises an antenna array formed on or in the first carrier.

8. The RF system according to claim 7, wherein the antenna array is disposed on more than one surface located at different sides of the first carrier.

9. A radio frequency (RF) system comprising:
a flexible circuit board having a notch;
a first antenna module disposed on the flexible circuit board and covering the notch, the first antenna module comprising a first carrier, a first antenna element disposed on or in the first carrier, and a first conductive member between the first carrier and the flexible circuit board; and
a RF chip disposed in the notch.

10. The RF system according to claim 9, further comprising a second antenna module disposed on the flexible circuit board.

11. The RF system according to claim 10, wherein the first antenna module and the second antenna module are disposed on the same side of the flexible circuit board.

12. A communication device comprising:
the RF system according to claim 1;
a main board; and
a connection element electrically connecting the flexible circuit board and the main board.

13. The communication device according to claim 12, further comprising a housing, wherein the RF system comprises a first RF system and a second RF system respectively located at a first position and a second position in the housing.

14. A radio frequency (RF) system comprising:
a flexible circuit board comprising a first portion with no bending part, the first portion having a first surface and a second surface, wherein the first surface and the second surface are opposite surfaces of the first portion;
a first antenna module disposed on the first surface, the first antenna module comprising a first carrier, a first antenna element disposed on or in the first carrier, and a first conductive member between the first carrier and the flexible circuit board; and
a RF module disposed on the second surface and electrically connected to the first antenna module;
wherein the first antenna element comprises an antenna array formed on or in the first carrier, and the antenna array is disposed on more than one surface located at different sides of the first carrier.

15. The RF system according to claim 14, further comprising a second antenna module disposed on the flexible circuit board.

16. The RF system according to claim 15, wherein the flexible circuit board further comprises a second portion bent with respect to the first portion, and the second antenna module is disposed on the second portion.

17. The RF system according to claim 15, wherein the flexible circuit board further comprises a second portion thicker than the first portion, the first antenna module is disposed on the first portion, and the second antenna module is disposed on the second portion.

18. The RF system according to claim 15, wherein the second antenna module is disposed on the first surface or the second surface of the flexible circuit board.

19. The RF system according to claim 15, further comprising an additional RF module disposed on the flexible circuit board and opposite the second antenna module.

20. The RF system according to claim 15, wherein the second antenna module comprises a second carrier, a second antenna element disposed on or in the second carrier, and a second conductive member between the second carrier and the flexible circuit board.

* * * * *